United States Patent
Shiao et al.

(10) Patent No.: US 11,723,274 B2
(45) Date of Patent: Aug. 8, 2023

(54) SOLAR THERMOELECTRIC POWER GENERATION SYSTEM, AND PROCESS FOR MAKING SAME

(71) Applicant: certainteed corporation, Malvern, PA (US)

(72) Inventors: Ming Liang Shiao, Collegeville, PA (US); Gregory F. Jacobs, Oreland, PA (US); Joseph Charles Gombarick, Jr., Phoenixville, PA (US)

(73) Assignee: CertainTeed LLC, Malvern, PA (US)

( * ) Notice: Subject to any disclaimer, the term of this patent is extended or adjusted under 35 U.S.C. 154(b) by 66 days.

(21) Appl. No.: 16/811,205

(22) Filed: Mar. 6, 2020

(65) Prior Publication Data

US 2020/0321504 A1    Oct. 8, 2020

Related U.S. Application Data

(60) Division of application No. 15/861,447, filed on Jan. 3, 2018, now abandoned, which is a continuation of application No. 12/885,757, filed on Sep. 20, 2010, now abandoned.

(51) Int. Cl.
*H01L 35/00* (2006.01)
*H10N 10/13* (2023.01)

(52) U.S. Cl.
CPC ........ *H10N 10/13* (2023.02); *Y10T 29/49355* (2015.01)

(58) Field of Classification Search
CPC .... H01L 35/30; Y10T 29/49355; H10N 10/13
See application file for complete search history.

(56) References Cited

U.S. PATENT DOCUMENTS

| | | |
|---|---|---|
| 2,591,149 A | 4/1952 | Grove |
| 2,614,051 A | 10/1952 | Buzzell et al. |
| 2,898,232 A | 6/1956 | Miller et al. |
| 2,981,636 A | 4/1961 | Lodge et al. |
| 2,984,696 A * | 5/1961 | Hamilton ............ H01L 35/00 136/223 |
| 3,796,928 A | 3/1974 | Doo et al. |
| 3,906,221 A | 9/1975 | Mercier |
| 4,040,867 A | 8/1977 | Forestieri et al. |
| 4,201,193 A | 5/1980 | Ronc |

(Continued)

FOREIGN PATENT DOCUMENTS

| | | |
|---|---|---|
| DE | 4421078 | 2/1996 |
| DE | 19739948 | 3/1999 |

(Continued)

OTHER PUBLICATIONS

Translation of WO2010057579, pp. 1-14 (Year: 2010).*

(Continued)

*Primary Examiner* — Thanh Truc Trinh
(74) *Attorney, Agent, or Firm* — McDonnell Boehnen Hulbert & Berghoff LLP

(57) ABSTRACT

A solar thermoelectric power generation system includes roofing products such as shingles with solar heat reflective areas and roofing products with solar heat absorptive areas. Thermoelectric power generating elements are provided in thermal contact with the solar heat reflective areas and the solar heat absorptive areas.

10 Claims, 5 Drawing Sheets

Fig. 1

(56) References Cited

U.S. PATENT DOCUMENTS

| | | |
|---|---|---|
| 4,251,291 A | 2/1981 | Gomez |
| 4,390,595 A | 6/1983 | Yamagishi |
| 4,574,160 A | 3/1986 | Cull et al. |
| 4,640,977 A | 2/1987 | Shakun |
| 4,663,495 A | 5/1987 | Berman et al. |
| 4,692,557 A | 9/1987 | Samuelson et al. |
| 4,860,509 A | 8/1989 | Laaly et al. |
| 4,924,301 A | 5/1990 | Surbrook |
| 5,164,020 A | 11/1992 | Wayner et al. |
| D335,336 S | 5/1993 | Stiefel |
| 5,232,518 A | 8/1993 | Nath et al. |
| 5,271,201 A | 12/1993 | Noone et al. |
| 5,287,669 A | 2/1994 | Hannah et al. |
| 5,375,491 A | 12/1994 | Hannah et al. |
| 5,400,558 A | 3/1995 | Hannah et al. |
| 5,419,941 A | 5/1995 | Noone et al. |
| 5,421,134 A | 6/1995 | Hannah et al. |
| 5,427,519 A | 6/1995 | Gellert |
| 5,437,735 A | 8/1995 | Younan et al. |
| 5,472,519 A | 12/1995 | Howell et al. |
| 5,474,620 A | 12/1995 | Nath et al. |
| 5,554,819 A | 9/1996 | Baghai-Kermani |
| 5,575,861 A | 11/1996 | Younan et al. |
| 5,590,495 A | 1/1997 | Bressier et al. |
| 5,650,019 A | 7/1997 | Yamada et al. |
| 5,700,332 A | 12/1997 | Brown |
| 5,725,006 A | 3/1998 | Kawama et al. |
| 5,807,440 A | 9/1998 | Kubota et al. |
| 5,830,779 A | 11/1998 | Bressler et al. |
| 5,877,874 A | 3/1999 | Rosenberg |
| 5,973,050 A | 10/1999 | Johnson et al. |
| 6,049,035 A | 4/2000 | Tsuri et al. |
| 6,184,057 B1 | 2/2001 | Van Andel et al. |
| 6,203,194 B1 | 3/2001 | Beerwerth et al. |
| 6,245,987 B1 | 6/2001 | Shiomi et al. |
| 6,268,558 B1 | 7/2001 | Kubota |
| 6,274,860 B1 | 8/2001 | Rosenberg |
| 6,311,436 B1 | 11/2001 | Mimura et al. |
| 6,313,391 B1 | 11/2001 | Abbott |
| 6,331,671 B1 | 12/2001 | Makita et al. |
| 6,331,673 B1 | 12/2001 | Kataoya et al. |
| 6,369,314 B1 | 4/2002 | Nolas |
| 6,506,970 B2 | 1/2003 | Yamawaki |
| 6,613,598 B1 | 9/2003 | Middelman et al. |
| 6,710,238 B1 | 3/2004 | Shingu et al. |
| 6,762,508 B1 | 7/2004 | Kiso et al. |
| 6,857,425 B2 | 2/2005 | Flick |
| 6,883,290 B2 | 4/2005 | Dinwoodie |
| 6,914,182 B2 | 7/2005 | Takeda et al. |
| 6,928,775 B2 | 8/2005 | Banister |
| 7,227,078 B2 | 6/2007 | Jongerden et al. |
| 7,387,537 B1 | 6/2008 | Daily et al. |
| 7,422,898 B2 | 9/2008 | Sano et al. |
| 7,445,508 B2 | 11/2008 | Daily et al. |
| 7,572,396 B2 | 8/2009 | Gaudiana et al. |
| 7,592,066 B2 | 9/2009 | Shiao et al. |
| 7,681,363 B2 | 3/2010 | Banister |
| 2001/0050102 A1 | 12/2001 | Matsumi et al. |
| 2003/0121288 A1 | 7/2003 | Stoehr et al. |
| 2003/0154973 A1 | 7/2003 | Nyhart, Jr. et al. |
| 2004/0031219 A1 | 2/2004 | Banister |
| 2005/0072114 A1 | 4/2005 | Shiao et al. |
| 2005/0102947 A1 | 5/2005 | McCaskill et al. |
| 2005/0144870 A1 | 7/2005 | Dinwoodie |
| 2005/0178428 A1 | 8/2005 | Laaly et al. |
| 2005/0178429 A1 | 8/2005 | McCaskill et al. |
| 2005/0178430 A1 | 8/2005 | McCaskill et al. |
| 2005/0263179 A1 | 12/2005 | Gaudiana et al. |
| 2005/0268962 A1 | 12/2005 | Gaudiana et al. |
| 2006/0032527 A1 | 2/2006 | Stevens et al. |
| 2006/0042683 A1 | 3/2006 | Gangemi |
| 2006/0048812 A1 | 3/2006 | Tomita |
| 2006/0243318 A1 | 11/2006 | Feldmeier et al. |
| 2007/0251571 A1 | 11/2007 | Jacobs et al. |
| 2008/0006323 A1 | 1/2008 | Kalkanoglu et al. |
| 2008/0029146 A1 | 2/2008 | Plissonnier et al. |
| 2008/0178928 A1 | 7/2008 | Warfield et al. |
| 2008/0271773 A1 | 11/2008 | Jacobs et al. |
| 2008/0271774 A1 | 11/2008 | Kalkanoglu et al. |
| 2009/0000221 A1 | 1/2009 | Jacobs et al. |
| 2009/0000657 A1 | 1/2009 | Jacobs |
| 2009/0014051 A1 | 1/2009 | Gumm |
| 2009/0072078 A1 | 3/2009 | Choi et al. |
| 2009/0110818 A1 | 4/2009 | Teng et al. |
| 2009/0133340 A1 | 5/2009 | Shiao et al. |
| 2009/0133738 A1 | 5/2009 | Shiao et al. |
| 2009/0133739 A1 | 5/2009 | Shiao et al. |
| 2009/0133740 A1 | 5/2009 | Shiao et al. |
| 2009/0159118 A1 | 6/2009 | Kalkanoglu et al. |
| 2009/0178350 A1 | 7/2009 | Kalkanoglu et al. |
| 2009/0194143 A1 | 8/2009 | Jacobs et al. |
| 2009/0205270 A1 | 8/2009 | Shaw et al. |
| 2009/0242015 A1 | 10/2009 | Wattman et al. |
| 2009/0260667 A1 | 10/2009 | Chen et al. |
| 2010/0294327 A1 | 11/2010 | Park et al. |

FOREIGN PATENT DOCUMENTS

| | | | |
|---|---|---|---|
| FR | 2896596 | 1/2006 | |
| FR | 2890181 | 9/2007 | |
| FR | 2896596 | 1/2008 | |
| JP | 2001332752 | 11/2001 | |
| JP | 06-045628 A | 2/2006 | |
| JP | 08-139347 A | 6/2008 | |
| WO | 2007035677 | 3/2007 | |
| WO | 2007079895 | 7/2007 | |
| WO | 2008153686 | 12/2008 | |
| WO | WO2010057579 | * 5/2010 | ............ H01L 35/30 |

OTHER PUBLICATIONS

Abstract of JP 02094575 (1990).

Abstract of JP 08312089 (1996).

Abstract of JP 201188411 (2000).

Abstract of JP 10093125 (1988).

Abstract of JP 63299171 (1988).

Abstract of JP 63213978 (1988).

Sunpower "T5 Solar Roof Tile, Exceptional Efficiency & Performance." (2009).

D.L. King, et al., Field Experience with a New Performance Characterization Procedure for Photovoltaic Arrays, Sandia National Laboratories, 2nd World Conference and Exhibition on Photovoltaic Solar Energy Conversion, Jul. 6-10, 1998, Vienna, Austria.

D. Aiken et al., Temperature Dependent Spectral Response Measurements for III-IV Multi-Junction Solar Cells, "Whitepaper," Emcore Photovoltaics, Nov. 19, 2003.

N.J.C.M Van Der Borg et al., Building Integration of Photovoltaic Power Systems Using Amorphous Silicon Modules: Irradiation Loss Due to Non-Conventional Orientations, ECN-C-01-068, Dec. 2001.

J.J. Klaassen et al., AlGaN Photodiodes Respond to Ultraviolet C, DRC9925, NASA Tech Briefs, Feb. 2000.

S. Silvestre et al., A Fast-Low-Cost Solar Cell Spectral Response Measurement System with Accuracy Indicator, IEEE Transactions on Instrumentation and Measurement, 48(5), pp. 944-948, Oct. 1999.

N.G.J.H.M. Van Stark, et al., Modeling Improvement of Spetral Response of Solar Cells by Deployment of Spectral Converters Containing Semiconductor Nanocrystals, Semiconductors, 38(8), pp. 962-969 (2004).

N.H. Reich et al., Weak light performance and spectral response of different solar cell types in: Proceedings of the 20th European Photovotaic Solar Energy Conference (Eds. W. Palz, H. Ossenbrink, Ph. Helm), WIP-Renewable Energies, Munich, Germany 2005, pp. 2120-2123.

Solar Electric Roof Tile: C21e, Solarcentury, 2006.

H. Field, Solar Cell Spectral Response Measurement Errors Related to Spectral Band Width and Chopped Light Form, 26th IEEE Photovoltaic Specialists Conference, Sep. 29-Oct. 3, 1997, Anaheim, CA.

(56) References Cited

OTHER PUBLICATIONS

H. Hunter Fanney, Short-Term Characterization of Building Integrated Photovoltaic Panels, Proceeding of Solar Forum 2002: Sunrise on the Reliable Energy Economy, Jun. 15-19, 2002, Reno, NV.
Ye-Guang Deng, et al., Journal of Renewable and Sustainable Energy, 1, 052701 (2009).
CRC Handbook of Thermoelectrics, Sect. D., Chapters 19-24 (D.M. Rowe, ed., 1995).
U.S. Appl. No. 12/885,757, filed Sep. 20, 2010 (grandparent of the present application).
U.S. Appl. No. 15/861,447, filed May 24, 2018 (parent of the present application).

\* cited by examiner

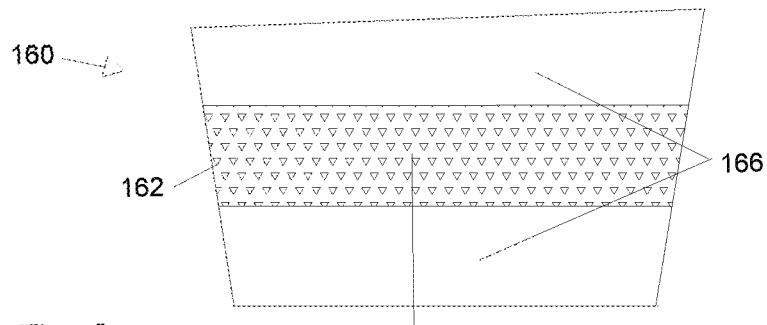
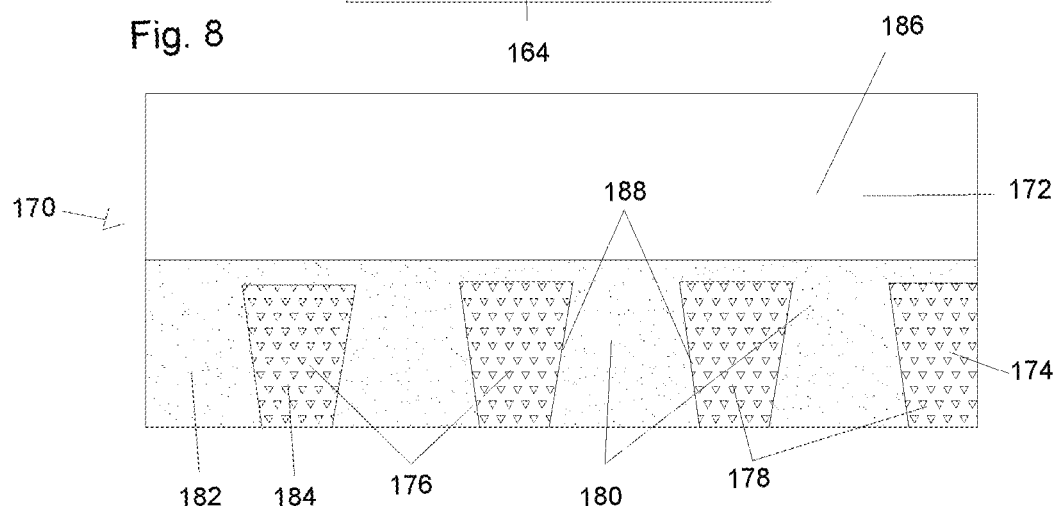
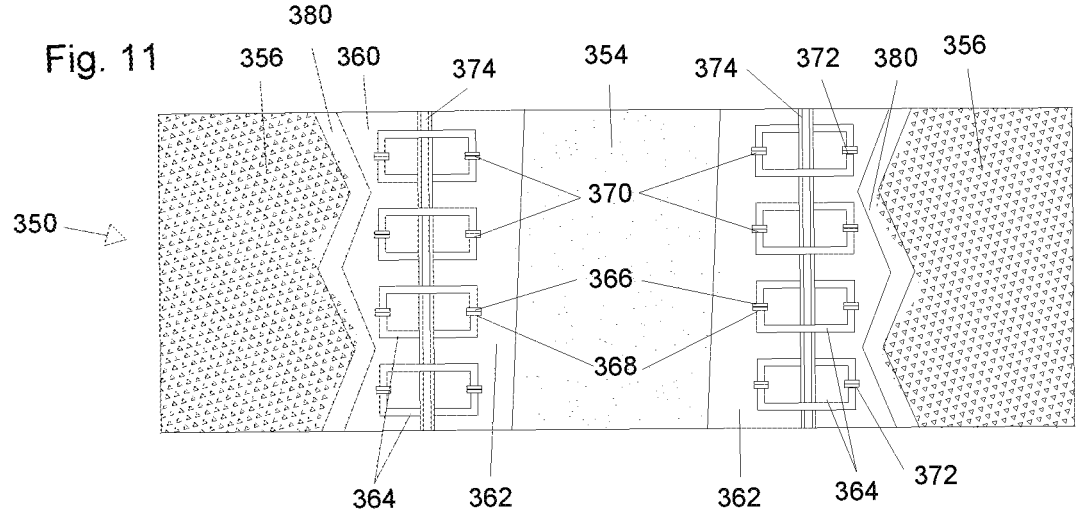

SOLAR THERMOELECTRIC POWER GENERATION SYSTEM, AND PROCESS FOR MAKING SAME

CROSS-REFERENCE TO RELATED APPLICATIONS

This application is a divisional of U.S. patent application Ser. No. 15/861,447, filed Jan. 3, 2018, which was a continuation of U.S. patent application Ser. No. 12/885,757, filed Sep. 20, 2010, each of which is hereby incorporated herein by reference in its entirety.

BACKGROUND OF THE INVENTION

1. Field of the Invention

The present invention relates to a system and method for the generation of electrical power from roofing, such as roofing shingles, and processes for making such roofing.

2. Brief Description of the Prior Art

The developed world is heavily dependent on fossil fuel as an energy source for generating electricity. An unfortunate side effect has been the production of large quantities of carbon dioxide as a by-product, and the consequent accumulation of carbon dioxide in the Earth's atmosphere, leading to anthropomorphic global warming.

In North America residential roofs are most frequently covered with bituminous roofing shingles, although other types of roofing materials, such as slate, synthetic slate, wood such as cedar shake, and metal such as steel, are also employed. Typical roofing shingles based upon bitumen materials are known to absorb significant solar heat and thus contribute to the so-called "Urban Heat Island" effects. The Heat Island Group at the Berkeley National Laboratory has noted that surface temperatures of a roof can be very different due to their solar reflectance. Absorption of heat by roofing materials not only creates higher energy demand for HVAC systems, but also contributes to global warming. In the past several years, many attempts have been made to make use of the solar radiation incident on roofs, such as solar hot water systems. Currently, solar-thermal systems are being installed on residential roofs for water heating use. However, such systems are typically not fully integrated into the roof system, and as a result they can significantly negatively affect the aesthetics of a roof. Thus, it would be advantageous to have a roof that is aesthetically pleasing and also can generate solar power from the solar heat gain.

Further, recently there has been increased focus on producing electricity from renewable energy sources, such as by employing wind turbines, and solar-powered photovoltaic cells. The rooftop use of photovoltaic devices to generate electrical power and the use of solar water heating devices are well known. In either case, the conventional appearance of roofs is ordinarily compromised by the functional requirements of such devices. Efforts have been made to reduce the aesthetic impact of applying photovoltaic devices to roofing, such as disclosed, for example, in U.S. Patent Publication No. 2008/0006323 A1.

In addition to photoelectric devices, which make use of the incident solar energy flux to generate an electrical current through the photovoltaic effect, efforts have been made to exploit the thermoelectric effect to generate an electrical current from heat generated from solar radiation incident on roofing. The thermoelectric effect is the direct conversion of temperature differences to electrical voltage and vice versa. A thermoelectric device, such as a thermocouple, creates an electrical voltage when there is a different temperature on either side of the device.

One side of a thermoelectric device can be exposed to the sun to heat the device, while the other side can be cooled, as by applying water for evaporative cooling, and the device can be mounted on a roof, such as disclosed in U.S. Pat. No. 5,554,819, to generate electricity. Solar power farms that convert solar heat directly into electricity by using solar heat collectors to heat liquids for power generation have been proposed. However, such farms are typically large in scale and are not designed for individual roofs. In addition, externally-installed small solar power generators which can generate electrical power by heating liquids with a solar heat concentrator to power electrical generators have been proposed. However, they cannot be easily integrated into roof systems, and hence are not aesthetically pleasing. Solar radiation applied to the thermoelectric device can be concentrated, such as by using a lens, in order to achieve a greater temperature differential, such as disclosed in U.S. Patent Publication No. 2009/0260667 A1, or solar heat can be transferred to a heat storage medium so that thermoelectric power can be provided during low sunlight periods, such as disclosed in U.S. Pat. No. 4,251,291. Industrial scale thermoelectric solar power systems have been proposed, such as disclosed in U.S. Pat. No. 6,313,391, and have received consideration as replacement for fossil fuel-driven systems, as reported in Ye-Guang Deng et al., Journal of Renewable and Sustainable Enemy, 1, 052701 (2009).

A thermoelectric roof solar heat collector has been employed to power a ventilating fan for cooling. S. Maneewan et al. "Heat Gain Reduction by Means of Thermoelectric Roof Solar Collector," Solar Enemy, 78, pp. 495-503 (2005). U.S. Pat. No. 6,857,425 discloses a solar energy collector system including a thermopile unit for generating electricity. U.S. Patent Publication No. 2008/0029146 A1 discloses a thermoelectric structure formed from a network of wires and use of the thermoelectric structure to form a textile structure. International Patent Publication No. WO 2007/071890 A1 discloses a thermally insulating thermoelectric roofing element including a thermally insulating body which is covered with pairs of interconnected elements formed from a first and a second conductive material, such as a first and a second conductive polymer. The conductive polymers, such as polyaniline or polyacetylene, are doped differently. The geometry is such that junctions are formed between the elements in each pair on opposite sides of the thermally insulating body so that a Seeback voltage is developed between the junctions when one side of the insulating body is heated, as by solar radiation. Thermoelectric elements mounted in roofing tiles are disclosed in German Patent Publication DE 199 46 806 A1.

U.S. Pat. No. 7,241,500 discloses that the surface solar reflectance of a roofing shingle can be varied independently of the color, by preferentially reflecting the near infrared radiation of solar spectrum, which contains no color information.

There is a continuing need for electric power sources that use incident solar radiation as an energy source as a substitute for power sources that consume non-renewable resources and produce carbon dioxide implicated in anthropomorphic global warming.

SUMMARY OF THE INVENTION

The present invention provides a solar thermoelectric power generation system. In one embodiment the system of the present invention includes a roofing product, such as a roofing shingle, roofing tile, synthetic roofing tile, or the like, including at least one solar heat reflective area, a roofing product such as a roofing shingle including at least one solar heat absorptive area, and at least one thermoelectric power generating element in thermal contact with the at least one solar heat reflective area and the at least one solar heat absorptive area. The at least one solar heat reflective area and the at least one solar heat adsorptive area can be included on the same roofing product, such as on the same roofing shingle, or they can be provided on different roofing products. Preferably, the at least one thermoelectric power generating element has a first junction in thermal contact with the at least one solar heat reflective area and a second junction in thermal contact with the at least one solar heat absorptive area. Thus, in one aspect, the system preferably comprises a roofing product such as a roofing shingle including both at least one solar heat reflective area and at least one solar heat absorptive area.

In another aspect, the at least one solar heat reflective area and the at least one solar heat absorptive area have a similar appearance and more preferably the same appearance. Preferably, the at least one solar heat reflective area differs in E* from the at least one solar heat absorptive area by no more that 10. More preferably the at least one solar heat reflective area differs in E* from the at least one solar heat absorptive area by no more that 5, and still more preferably by no more than 2.

Preferably, the system includes a plurality of thermoelectric power generating elements electrically connected in series to provide a predefined output voltage.

In another aspect of the present invention, the solar heat reflective area preferably includes solar heat reflective roofing granules. Further, in this aspect of the invention, the solar heat absorptive area preferably includes solar heat absorptive roofing granules.

In yet another aspect of the present invention, the system further comprises thermal insulation between the solar heat reflective area and the solar heat absorptive area.

The present invention also provides roofing products such as roofing shingles for use in a solar thermoelectric power generating system. The roofing products of the present invention comprise at least one solar heat reflective area, at least one solar heat absorptive area, and at least one thermoelectric power generating element in thermal contact with the at least one solar heat reflective area and the at least one solar heat absorptive area. Preferably, the at least one thermoelectric power generating element has a first junction in thermal contact with the at least one solar heat reflective area and a second junction in thermal contact with the at least one solar heat absorptive area. Preferably, the roofing product includes both at least one solar heat reflective area and at least one solar heat absorptive area. Preferably, the at least one solar heat reflective area differs in E* from the at least one solar heat absorptive area by no more that 10, more preferably by no more that 5, and still more preferably by no more than 2. Preferably, the system includes a plurality of thermoelectric power generating elements electrically connected in series to provide a predefined output voltage.

Preferably, the solar heat reflective area includes solar heat reflective roofing granules. Preferably, the solar heat absorptive area includes solar heat absorptive roofing granules.

Preferably, in one aspect the solar thermoelectric power generating system of the present invention further comprises thermal insulation between the solar heat reflective area and the solar heat absorptive area.

The present invention also provides a method of generating electric power. The method comprises providing a roofing product such as a roofing shingle, including at least one solar heat reflective area; providing a roofing product, such as a roofing shingle including at least one solar heat absorptive area; providing at least one thermoelectric element in thermal contact with the at least one solar heat reflective area and the at least one solar heat absorptive area; exposing the roofing product to solar radiation; and drawing electric current from the at least one thermoelectric element.

Preferably, the at least one thermoelectric element has a first junction in thermal contact with the at least one solar heat reflective area, and a second junction in thermal contact with the at least one solar heat absorptive area.

In another aspect, the present invention provides a process for a process for making a solar thermoelectric power generating system. The process comprises providing a roofing product such as a roofing shingle including at least one solar heat reflective area; providing a roofing product such as a roofing shingle including at least one solar heat absorptive area; providing at least one thermoelectric element in thermal contact with the at least one solar heat reflective area and the at least one solar heat absorptive area; and installing the roofing product on a roof.

In yet another aspect, the present invention provides a roofing product such as a roofing shingle for use in a solar thermoelectric power generating system in which the roofing product comprises a first solar heat reflective area having a first average solar reflectivity, the first area being at least 5 mm$^2$; and a second solar heat reflective area having a second average solar reflectivity, the second area being at least 5 mm$^2$; wherein the difference between the first solar heat reflectivity and the second solar heat reflectivity is at least five percent. Preferably, the difference between the first solar heat reflectivity and the second solar heat reflectivity is at least ten percent, and more preferably, at least twenty percent.

In another aspect, the present invention provides a solar thermoelectric power generation system, the system comprising an overlay for a roofing product, such as a roofing shingle, the overlay including at least one solar heat reflective area; and at least one solar heat absorptive area. The system further comprises at least one thermoelectric power generating element in thermal contact with the at least one solar heat reflective area and the at least one solar heat absorptive area. The overlay can be applied to an existing roofing surface, or used to fabricate new roofing products.

BRIEF DESCRIPTION OF THE FIGURES

FIG. 7 is a schematic representation of a portion of a thermoelectric roofing shingle according to the present invention showing a third scheme for placement of areas of enhanced solar heat absorption and reduced solar absorption.

FIG. 8 is a schematic representation of a portion of a thermoelectric roofing shingle according to the present invention showing a fourth scheme for placement of areas of enhanced solar heat absorption and reduced solar absorption.

FIG. 11 is a schematic representation of an overlay for a roofing shingle for providing a thermoelectric generating system according to the present invention.

DETAILED DESCRIPTION

Figure 1:
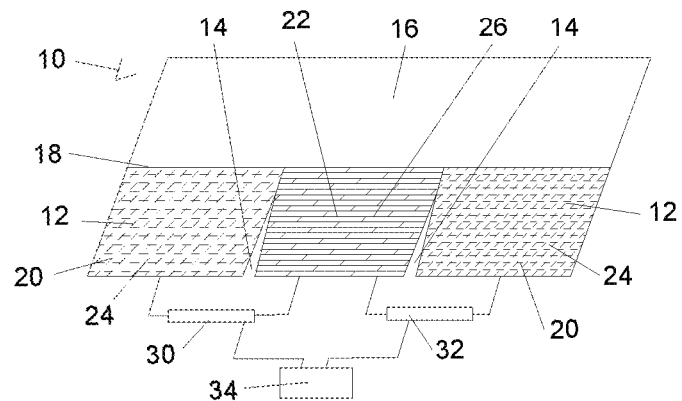
FIG. 1 is a schematic representation of a first embodiment of a thermoelectric roofing shingle according to the present invention.

The present invention provides electrical power generated from incident solar radiation. In the present invention, thermal-electric materials are employed to bridge roof surfaces with different solar heat absorption or solar reflectance, but with the same or similar appearance. Thus, adjacent surfaces on a roof can have a significant temperature difference. In one aspect of the present invention, areas of the roof having different solar reflectance have different colors. In another aspect of the present invention, areas of a roof having different solar reflectance have the same or similar colors. By bridging these areas having different temperatures with electrically conductive materials connected to exhibit the Seebeck or Thomson thermoelectric effect, electric current is generated from the difference in temperature between the roof areas with different solar reflectance. The electrically conductive materials can be connected, for example, in parallel to increase current flow, or in series to increase potential.

As used in the present specification and claims:

"Colored" means having an L* value of less than 85, preferably less than 55, even more preferably less than 45, when measured using a HunterLab Model Labscan XE spectrophotometer using a 0 degree viewing angle, a 45 degree illumination angle, a 10 degree standard observer, and a D-65 illuminant. "Colored" as so defined is intended to include relatively dark tones.

"Solar heat reflective," "infrared reflective," and "SR" mean having enhanced reflectance in the near infrared range. When referring to areas of roofing shingles, "solar heat reflective" means having a greater solar heat reflectance than a shingle having the same or similar appearance colored with conventional pigments.

"Solar heat absorptive" means having diminished reflectance in the near infrared range. When referring to areas of roofing shingles, "solar heat absorptive" means having less solar heat reflectance than a shingle having the same or similar appearance which has enhanced solar heat reflectance. The conventional roofing shingles are "solar heat absorptive" compared with solar heat reflective roofing shingles.

"Thermocouple" means a pair of thermoelectric elements having different electrical properties and electrically connected at a working junction, such that a difference in temperature between the working junction and other portions of the thermoelectric element which are remote from the working junction generates an electric potential such that when the remote portions of the thermoelectric elements are connected in a suitable circuit, an electric current flows.

"Thermoelectric element" means a conductor, semiconductor or intermetallic compounds having specific electrical properties. Examples of thermoelectric elements include N-type thermoelectric elements and P-type thermoelectric elements. Examples of semiconductor materials useful for forming P-type thermoelectric elements include solid solutions of bismuth telluride and antimony telluride. Examples of semiconductor materials useful for forming N-type thermoelectric elements include solid solutions of bismuth telluride and bismuth selenide.

"Thermoelectric module" means an array of thermocouples connected electrically in series but thermally in parallel.

The strength in color space E* is defined as $E^* = (L^{*2} + a^{*2} + b^{*2})^{1/2}$, where L*, a*, and b* are the color measurements for a given sample using the 1976 CIE L*a*b* color space. The total color difference ΔE* is defined as $\Delta E^* = (\Delta L^{*2} + \Delta a^{*2} + \Delta b^{*2})^{1/2}$ where ΔL*, Δa*, and Δb* are respectively the differences in L*, a* and b* for two different color measurements.

In one aspect of the present invention, roof-surfacing material, such as bituminous roofing shingles or roofing membrane, has areas of enhanced solar heat reflectance compared with other areas, but otherwise has the same or similar appearance. The appearance of the roof-surfacing material is typically determined by a number of different factors, such as the roughness of the surface and the color of the material used to form the surface, as well as the perception of the observer. In the case of roofing shingles covered with roofing granules, a similar appearance can be achieved using granules of similar size distribution and shape, and similar colors. Roofing granules are typically colored by coating base materials with an inorganic semi-ceramic coating containing durable inorganic pigments such as iron oxide. Shingles may be coated with mixtures of granules having different colors. In order to achieve a similar appearance, areas having an enhanced solar heat reflectance preferably differ in color space strength (E*) from solar heat absorptive areas by no more than 10, more preferably by no more than 5, and still more preferably by no more than 2. In terms of hue, preferably the at least one solar heat reflective area differs in $((a^*)^2 + (b^*)^2)^{1/2}$ (in the L*a*b* color system) from the at least one solar heat absorptive area by no more that 10, more preferably by no more that 5, and still more preferably by no more than 2. Preferably, in terms of brightness or lightness the at least one solar heat reflective area differs in L* (in the L*a*b* color system) from the at least one solar heat absorptive area by no more that 10. More preferably the at least one solar heat reflective area differs in L* from the at least one solar heat absorptive area by no more than 5, and still more preferably by no more than 2.

Examples of roofing surfacing materials or roofing products that can be employed in the processes and articles of the present invention including bituminous roofing shingles, bituminous roofing sheet materials, roofing slate, synthetic roofing tiles, ceramic roofing tiles, cedar roofing shakes, synthetic simulated roofing shakes, and metal roofing sheet materials.

Conventionally, roofing granules are prepared using a metal silicate coating binder. The roofing granules of the present invention can be prepared through traditional granule preparation methods, such as those disclosed in U.S. Pat. No. 2,981,636, incorporated herein by reference. Thus, in preparing roofing granules according to the present invention, one or more exterior coating layers can be applied to the base particles. Each such exterior coating layer includes a suitable coating binder. The coating binder can be an inorganic or organic material, and is preferably formed from a polymeric organic material or a silicaceous material, such as a metal-silicate binder, for example an alkali metal silicate, such as sodium silicate. When a metal-silicate binder is employed in the preparation of roofing granules of the present invention, the binder preferably includes a heat-reactive aluminosilicate material, such as clay, preferably, kaolin. Alternatively, the metal silicate binder can be insolubilized chemically by reaction with an acidic material, for example, ammonium chloride, aluminum chloride, hydrochloric acid, calcium chloride, aluminum sulfate, and magnesium chloride, such as disclosed in U.S. Pat. Nos. 2,591,149, 2,614,051, 2,898,232 and 2,981,636, each incorporated herein by reference, or other acidic material such as aluminum fluoride. In another alternative, the binder can be a controlled-release sparingly water-soluble glass such as a phosphorous pentoxide glass modified with calcium fluoride, such as disclosed in U.S. Pat. No. 6,143,318, incorporated herein by reference.

The exterior coating layer or layers can contain functional additives or fillers, such as colorant pigments, solar reflective pigments, near infrared reflective particles, photocatalytic particles, organic or inorganic biocides, algaecides, or other biocides.

The base particles employed in the process of preparing the granules of the present invention are preferably chemically inert materials, such as inert mineral particles. The mineral particles, which can be produced by a series of quarrying, crushing, and screening operations, are generally intermediate between sand and gravel in size (that is, between about 8 US mesh and 70 US mesh), and preferably have an average particle size of from about 0.2 mm to about 3 mm, and more preferably from about 0.4 mm to about 2.4 mm.

In particular, suitably sized particles of naturally occurring materials such as talc, slag, granite, silica sand, greenstone, andesite, porphyry, marble, syenite, rhyolite, diabase, greystone, quartz, slate, trap rock, basalt, and marine shells can be used, as well as recycled manufactured materials such as crushed bricks, concrete, porcelain, fire clay, proppants, and the like.

Solid and hollow glass spheres are available, for example, from Potters Industries Inc., P. O. Box 840, Valley Forge, Pa. 19482-0840, such as SPHERIGLASS® solid "A" glass spheres product grade 1922 having a mean size of 0.203 mm, product code 602578 having a mean size of 0.59 mm, BALLOTTINI impact beads product grade A with a size range of 600 to 850 micrometers (U.S. Sieve size 20-30), and QCEL hollow spheres, product code 300 with a mean particle size of 0.090 mm. Glass spheres can be coated with a suitable coupling agent, if desired, for better adhesion to the binder of the coating composition. Exemplary coupling agents include organosilanes, organotitanates, and organozirconates.

Suitable inert base particles, for example, mineral particles with size passing #8 mesh and retaining on #70 mesh, can be coated with a combination of a metal-silicate binder, kaolin clay, composite nanoparticles, color pigments such as metal oxide pigments to reach desirable colors, and biocidal particles, followed by a heat treatment to obtain a durable coating.

When the coated granules are fired at an elevated temperature, such as at least 800 degrees F., and preferably at 1,000 to 1,200 degrees F., the clay binder densifies to form strong particles.

In some embodiments of the present process, the coated granules are fired in an inert atmosphere in order to minimize and/or control oxidation.

Examples of clays that can be employed in the process of the present invention include kaolin, other aluminosilicate clays, Dover clay, bentonite clay, etc.

In the alternative, a suitable silicaceous binder can be formed from sodium silicate, modified by the addition of sodium fluorosilicate, aluminum fluoride, and/or Portland cement.

Roofing granules of the present invention can be colored using conventional coatings pigments. Examples of coatings pigments that can be used include those provided by the Color Division of Ferro Corporation, 4150 East 56th St., Cleveland, Ohio 44101, and produced using high temperature calcinations, including PC-9415 Yellow, PC-9416 Yellow, PC-9158 Autumn Gold, PC-9189 Bright Golden Yellow, V-9186 Iron-Free Chestnut Brown, V-780 Black, V0797 IR Black, V-9248 Blue, PC-9250 Bright Blue, PC-5686 Turquoise, V-13810 Red, V-12600 Camouflage Green, V12560 IR Green, V-778 IR Black, and V-799 Black.

Examples of roofing granules with high solar heat reflectance are disclosed, for example, in U.S. Pat. Nos. 7,241,500 and 7,452,598, and U.S. Patent Publication 2006/0251807 A1, each incorporated herein by reference. Examples of solar heat reflective roofing membranes are disclosed, for example, in U.S. Pat. Nos. 7,422,989 and 7,592,066, and U.S. Patent Publication 2007/0054129 A1, each incorporated herein by reference.

For example, roofing granules with enhanced solar reflectance can be formed by the combination of a binder, for example, a metal silicate binder or polymeric binder suitable for outdoor exposure, and special pigments that have high reflective properties toward the solar heat radiation. Such pigments can in some instances simultaneously serve as a colorant. Specifically, colored, infrared-reflective pigments, such as those disclosed in U.S. Pat. No. 6,174,360 (incorporated herein by reference) and comprising a solid solution including iron oxide, can be employed in producing colored infrared-reflective roofing granules of the present invention. The colored, infrared-reflective pigment can also comprise a near infrared-reflecting composite pigment such as disclosed in U.S. Pat. No. 6,521,038 (incorporated herein by reference). Composite pigments are composed of a near-infrared non-absorbing colorant of a chromatic or black color and a white pigment coated with the near infrared non-absorbing colorant.

In addition to, or in the alternative to, employing colored, infrared-reflective pigments selected from the group consisting of a solid solution including iron oxide and near infrared-reflecting composite pigments, infrared-reflective roofing granules for use in the present invention can be prepared using infrared-reflective "functional" pigments. Infrared-reflective functional pigments include light-interference platelet pigments including titanium dioxide, light-interference platelet pigments based on metal oxide coated-substrates, mirrorized silica pigments based upon metal-doped silica, and alumina. Such infrared-reflective functional pigments have been found to enhance the solar heat reflectance when incorporated in roofing granules.

Thus, in one aspect, the present invention employs roofing granules colored by light-interference platelet pigments and/or infrared ("IR")-reflective color pigments to achieve higher solar heat reflection. These "pearlescent" pigments based on metal oxide-coated substrates allow additional solar reflection to achieve both colors and increased solar heat reflection. Light-interference platelet pigments based on metal oxide coated-substrates are preferably selected from those pigments constructed from partially opaque substrates, such as mica, alumina, or silica, and metal-oxide coatings having light-interference properties.

Colored infrared-reflective roofing granules can be obtained by coating inert mineral particles with a first coating composition including a binder and at least one reflective white pigment, and curing the first coating composition on the inert mineral particles to form base particles. The base particles are then coated with a second coating composition including a binder and at least one colorant selected from the group consisting of uv-stabilized dyes and granule coloring pigments, and the second coating composition is then cured. The granule coloring pigments can be conventional granule coloring pigments based on metal oxides, or colored infrared-reflective pigments. Optionally, the second coating composition can include at least one infrared-reflective functional pigment.

In yet another aspect, the present invention employs infrared-reflective roofing granules obtained by a process comprising providing an inert mineral particle and coating the inert mineral particles with a first coating composition including a base particle binder, and optionally at least one colorant selected from the group consisting of UV-stabilized dyes and granule coloring pigments, and curing the first coating composition on the inert particles to form base particles. The base particles are then coated with a second coating composition including a coating binder, and at least one infrared-reflective functional pigment selected from the group consisting of light-interference platelet pigments including mica, light-interference platelet pigments including titanium dioxide, mirrorized silica pigments based upon metal-doped silica, and alumina, and the second coating composition is then cured.

Furthermore, the roofing granules employed in the present invention (including those with enhanced solar heat reflectance) can have other functionalities, such as algaecidal, photo-catalytic, or improved adhesion to the bitumen substrate.

In one aspect of the present invention, a first area of a roof surface is covered with a first material having a first solar heat reflectance and a second area of the roof surface is covered with a second material having a second solar heat reflectance, the first solar heat reflectance being different from the second solar heat reflectance. The first and second areas are bridged by thermoelectric elements, for example, a first thermoelectric element and a second thermoelectric element, with pairs of the first and second thermoelectric elements forming thermocouples. The thermocouples are positioned and connected electrically such that a difference in temperature between the first area and the second area generates an electrical potential in the thermocouple. Thus, electric current is generated from incident solar radiation by the surface temperature differences between the first and second areas of the roof surface.

In a presently preferred embodiment of the present invention, the first area and second areas of the roof surface are formed by using roofing granules having different solar heat reflectance. Preferably, the first area is formed using roofing granules having high solar heat reflectance, and the second area is formed using conventional roofing granules. Alternatively, the first area can be formed using roofing granules having high solar heat reflectance and the second area can be formed using granules having low solar heat reflectance. In another alternative, the first area can be formed using conventional roofing granules and the second area can be formed using granules having high solar heat reflectance.

In one aspect, roofing shingles according to the present invention comprise a first one solar heat reflective area having a first average solar reflectivity, with the first area being at least 5 mm$^2$; and a second solar heat reflective area having a second average solar reflectivity, with the second area being at least 5 mm$^2$; and the difference between the first solar heat reflectivity and the second solar heat reflectivity is at least five percent. Preferably, the difference between the first solar heat reflectivity and the second solar heat reflectivity is at least ten percent, and more preferably, at least twenty percent.

In another aspect, the present invention provides a solar thermoelectric power generation system based on an overlay for roofing shingles. In one embodiment of this aspect of the present invention, the overlay includes at least one solar heat reflective area; and at least one solar heat absorptive area. At least one thermoelectric power generating element in thermal contact with the at least one solar heat reflective area and the at least one solar heat absorptive area is also provided. The overlay can be applied to the upper surface of one layer of a shingle to provide a shingle with multiple layers to provide a desired aesthetic effect as well as a thermoelectric power generating system. The roofing granules selected so that the solar heat reflective area and the solar heat absorptive area can have a similar appearance, or the granules can be selected to provide a desired aesthetic effect. Further, the roofing granules employed in providing the overlay can be selected to be similar in appearance to the granules of the underlying shingle, or they can differ in appearance, such as to provide a desired aesthetic effect. A plurality of such overlays can be applied to the upper surface of the preexisting shingle, and the plurality can include overlays which are the same in size, shape and appearance or differ in size, shape, and/or appearance to provide desired aesthetic effects.

In another aspect, the present invention provides an overlay for roofing materials wherein the overlay includes areas which are more reflective than the underlying roofing material and thermoelectric elements. In yet another aspect, the present invention provides an overlay for roofing materials wherein the overlay includes areas which are less reflective than the underlying roofing material and thermoelectric elements.

In another embodiment of the present invention, the first and second areas of the roof surface are formed by different areas of a roofing membrane, such as roofing membranes fabricated from compositions comprising ethylene-propylene-diene-monomer rubber (EPDM), thermoplastic olefins (TPO), thermoplastic vulcanizates (TPV), or polyvinyl chloride (PVC), filled with pigments and fillers. In this embodiment, different areas of the roofing membrane are filled with different fillers, or pigmented using different pigments. For example, the first area of the roofing membrane can be filled with conventional fillers and/or pigment, while the second area can be filled with solar heat reflective fillers and or pigment. Roofing membranes filled with solar heat reflective filler are disclosed for example, in U.S. Patent Publication No. 2008/0097004 A1, incorporated herein by reference.

Examples of thermoelectric materials include metals, semiconductors, intermetallic compounds, and electrically conductive organic polymers. Examples of thermoelectric semiconductor materials useful in the present invention include those examples given in Section D, Chapters 19-34, of *CRC Handbook of Thermoelectrics* (D. M. Rowe, ed., 1995, incorporated herein by reference). Examples of thermoelectric materials include bismuth telluride; antimony telluride; solid solutions of bismuth telluride and antimony telluride; mixed crystals of bismuth, antimony, and telluride; lead telluride, lead tin tellurides, alloys of silver antimony telluride and germanium telluride, alkali silicides, alkaline earth silicides, rare earth silicides, Group IVB silicides, Group VB silicides, chromium silicides, molybdenum silicides, tungsten silicides, manganese silicides, rhenium silicides, iron silicides, ruthenium silicides, osmium silicides, cobalt silicides such as cobalt monosilicide, rhenium silicides, iridium silicides, nickel silicides, lead silicides, palladium silicides, and platinum silicides; polycrystalline iron disilicide, higher manganese silicides, silicon geranium, boron carbides, metallic alloys, intermetallic compounds; electrically conductive polymeric materials such as polymeric materials filled with carbon, including conductive carbon-filled vinyl elastomer, conductive carbon-filled nylon 12, and conductive carbon-filled polyphenylene sulfide; polymeric materials filled with nanophase metal particles such as disclosed in U.S. Pat. No. 5,973,050, incorporated herein by reference; polyaniline; polypyrrole; poly-N,N'(1,3-phenylenedimethylidyne)bis(3-ethynylaniline; tetrathiafulvalinium tetracyanoquinodimethanide), polyoctylthiophenes such as disclosed in U.S. Pat. No. 5,472,519 incorporated herein by reference; alternating poly(2,7-carbazole) derivatives; alkyl and benzoyl polyindolocarbazoles and polycarbazole derivatives; polydiindolocarbazole derivatives; carbon nanotube-filled polymeric materials, including carbon nanotube-filed poly(3,4-ethylenedioxythiophene) and poly(styrenesulfonate); and the like.

Advanced thermoelectric materials are disclosed, for example, in U.S. Patent Publication 2009/0072078 A1, incorporated herein by reference.

In another aspect of this invention, the thermoelectric elements are formed from metal, such as metal wire pairs joined to one another to form a thermocouple. Preferably, the metal wire pairs are chosen to have high Seebeck coefficients in order to maximize the power output. Thermocouples commonly used for temperature measurement, and the materials used for them, can be employed in the present invention. Any junction of dissimilar metals will produce an electric potential related to temperature.

The roofing granules of the present invention can be used to prepare roofing shingles. The roofing granules with different solar heat reflectance can either be different colors or similar colors, depending on the overall aesthetics desired for the shingles in which the roofing granules are incorporated. Further, the roofing granules with different solar heat reflectance can be located in areas of the same shingle, such that the areas are adjacent to each other. Alternatively, the roofing granules with different solar heat reflectance can be used to prepare different shingles, and the roofing shingles can be installed on a roof such that shingles bearing roofing granules with different solar heat reflectance are adjacent to one another.

The thermoelectric elements are preferably provided so that when the shingles are installed on a roof, the thermoelectric elements are in registration with the areas of different solar heat reflectance, such that the thermoelectric elements bridge the areas of different solar heat reflectance, and the working junctions of the pairs of thermoelectric elements forming the thermocouples are positioned within one of the areas of different solar heat resistance. In one presently preferred embodiment of the present invention, the thermoelectric elements are embedded on the backside of a shingle having areas of different solar heat reflectance. In this embodiment, each shingle is preferably provided with connectors for electrically connecting the thermocouple(s) in the shingle to those of another shingle. In another embodiment of the present invention, the thermoelectric elements are embedded in or secured to a sheet material, such as a roofing membrane or underlayment, which is overlaid with roofing shingles having areas of different solar heat reflectance. In this case, the sheet material is provided with conductors electrically connecting the thermocouple(s) underlying each shingle when the shingles are installed over the membrane on a roof.

Thus, in one aspect of the present invention, a first type of junction is included in a shingle construction in a first zone having a greater solar reflectance, and a second type of junction, analogous to a reference junction employed when a thermocouple is used as a temperature measurement device, is included in a second zone of the shingle construction having a lesser solar reflectance. In ambient conditions on the roof, the temperature differential creates a voltage potential between the two zones from which power is collected.

It is also understood that the surface area with different solar heat reflectance can be relatively small and distributed throughout the shingle surface in a "power grid" format in order to significantly increase power output.

The thermocouples in a single shingle can be connected electrically in parallel to increase current or in series to increase voltage, or in some other combination to achieve a desired output profile.

The shingles employed in the present invention can be formed using conventional techniques. In another aspect, thermally insulating material can be added to the shingle to improve the R value of the shingle, for example, by laminating a layer of thermal insulation material to the underside of a conventional shingle. The modified shingle, which is functionally similar to conventional shingles, but includes insulating material, would shield the underlayment below the shingles from the heating effects of the sun and allow a greater temperature differential between the shingle surface and the underlayment.

In this case, the thermoelectric elements, such as metal wires, extend below the non-solar heat reflective granules, through the solar heat reflective layer and make a connection with the underlayment or decking material, thus harnessing a greater potential than relying only on the laminated shingle itself. In this embodiment, the thermal differential driving the generation of power can be in the z-direction through the plane of the roofing product, in addition to or instead of across different areas of the plane as described above.

In another aspect of the present invention, the thermoelectric elements are embedded in or bonded to shingles formed from synthetic materials such as mineral-filled polymeric materials and shaped to simulate traditional roofing materials such as slate, cedar shakes, tiles, or the like. Alternatively, with the use of suitable electrical and thermal insulation, the thermoelectric elements are bonded to the underside of metal roofing. The upper or weather-exposed side of such shingles or metal roofing can be coated with heat reflective and heat absorptive material so provide thermal gradients between the junctions of the thermoelectric elements to provide electrical power.

Referring now to the figures in which like reference numerals represent like elements in each of the several views, there is shown in FIG. 1, a schematic representation of a first embodiment of a thermoelectric roofing shingle 10 according to the present invention. The shingle 10 includes three tabs 12 separated by cutouts 14 extending from a head lap portion 16 and a strip of sealant material 18 for adhering the tabs of an overlying shingle (not shown) to the shingle 10 when installing the shingles on a roof deck. The tabs 12 include two outer tabs 20 and an inner tab 22. The outer tabs 20 are covered with a first type of roofing granules 24, and the inner tab is coated with a second type of roofing granule 26. Processes for delivering different types of roofing granules to different areas of a roofing membrane are disclosed, for example, in U.S. Patent Publications 2009/0151288 A1, 2009/0110818 A1, 2006/0260731 A1, and 2005/0235599 A1, each incorporated herein by reference. The first type of roofing granule 24 is coated with a conventional non-solar heat reflective coating material thus forming non-solar heat reflecting granules, while the second type of roofing granule 26 is coated with a solar heat reflective coating material thus forming solar heat reflecting granules. However, the granule coatings are selected to make the outer tabs 20 and the inner tab 22 to have a very similar appearance and substantially the same color. In the alternative, the granule coatings can be selected to provide tabs with colors in a similar color family (such as complementary colors) or different colors such as contrasting colors, depending on the visual effect desired. A first thermoelectric element 30 formed from an n-type semiconductor materiel bridges one of the outer tabs 20 and the inner tab 22 and a second thermoelectric element 32 formed from a p-type semiconductor material bridges the second outer tabs 20 and the inner tab 22, and the first and second thermoelectric elements 30, 32 are in electrical contact with one another at a junction (not shown) positioned under the inner tab 22, and the other ends of the first and second thermoelectric elements 30, 32 are electrically connected to a load 34. When exposed to solar radiation, the non-solar heat reflective granules 24 absorb solar heat to a greater extent than the solar heat reflective granules 26, so that a temperature difference is created between the inner tab 22 and the outer tabs 20, which in turn creates an electrical potential difference between the junction between the thermoelectric elements 30, 32 under or within the inner tab 22, and the opposite ends of the thermoelectric elements 30, 32 under the outer tabs 20, driving an electric current to flow through the load 34.

Figure 2:
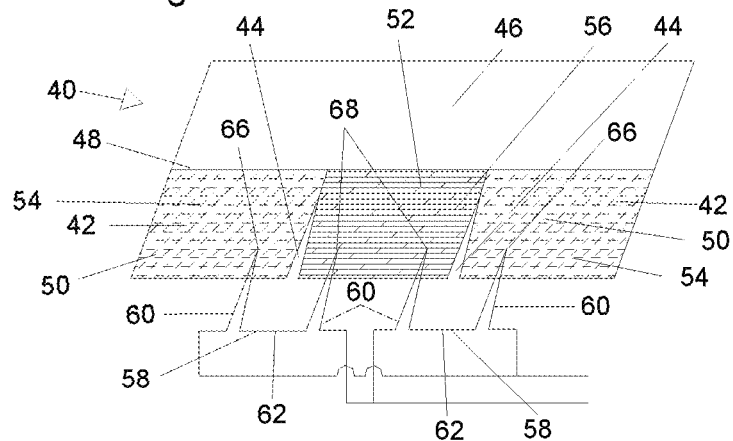
FIG. 2 is a schematic representation of a second embodiment of a thermoelectric roofing shingle according to the present invention.

FIG. 2 is a schematic representation of a second embodiment of a thermoelectric roofing shingle 40 according to the present invention. The shingle 40 includes three tabs 42 separated by cutouts 44 extending from a head lap portion 46 and a strip of sealant material 48 for adhering the tabs of an overlying shingle (not shown). The tabs 42 include two outer tabs 50 and an inner tab 52. The outer tabs 50 are covered with a first type of roofing granules 54 and the inner tab is coated with a second type of roofing granule 56. The first type of roofing granule 54 is coated with a conventional non-solar heat reflective coating material thus forming non-solar heat reflecting granules, while the second type of roofing granule 56 is coated with a solar heat reflective coating material thus forming solar heat reflecting granules. In this case, the granule coatings differ significantly in appearance and contribute to a decorative effect. A pair of thermocouples 58 bridges the outer tabs 50 and inner tab 52.

Each thermocouple 58 includes a first wire 60 formed from a first metal and a second wire 62 formed from a second metal. The first and second wires 60, 62 are connected under the outer tabs 50 at a first or hot junction 66 and under the inner tab 52 to form a second or cold junction 68, while the ends of the two thermocouples 58 are electrically connected in parallel to drive a load (not shown). When exposed to solar radiation, the non-solar heat reflective granules 54 absorb solar heat to a greater extent than the solar heat reflective granules 56, so that a temperature difference is created between the inner tab 52 and the outer tabs 50, which in turns creates an electrical potential difference between the hot junctions 66 and the cold junctions 68, driving an electric current to flow through the load.

Figure 3:
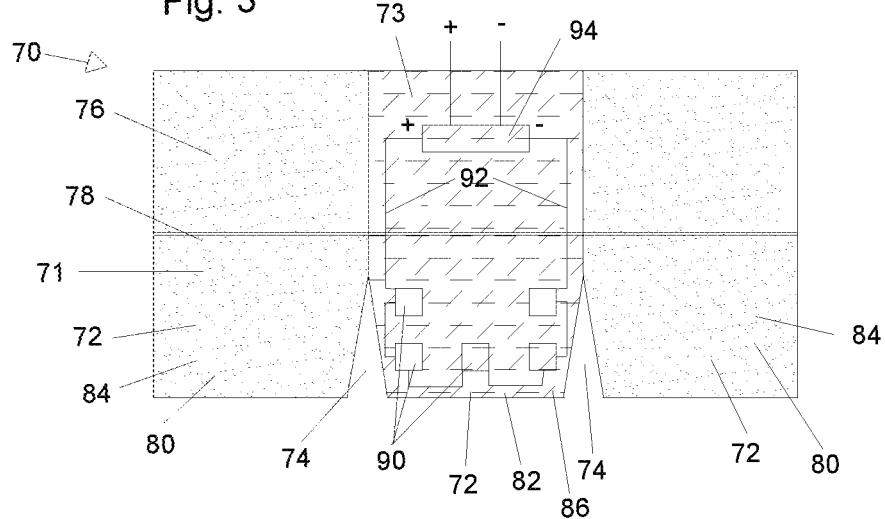
FIG. 3 is a schematic representation of a prototype of a third embodiment of a thermoelectric roofing shingle according to the present invention.

FIG. 3 is a schematic representation of a prototype of a third embodiment of a thermoelectric roofing shingle 70 according to the present invention. The shingle 70 is formed from an underlying base shingle 71 to which is laminated a partially overlying section 73 formed from a second shingle material. The resulting laminated shingle 70 includes three tabs 72 separated by cutouts 74 extending from a head lap portion 76 and a strip of sealant material 78 for adhering the tabs of an overlying shingle (not shown). The tabs 72 include two outer tabs 80 and an inner tab 82. The inner tab 82 and the adjacent area of the head lap portion 76 are overlaid with the congruent section 73 of a second layer of shingle material. The base shingle 71 is covered with a first type of roofing granules 84 and the overlying laminated section 73 is covered with a second type of roofing granule 86. In this case the second type of roofing granule 86 is coated with a conventional non-solar heat reflective coating material thus forming non-solar heat reflecting granules, while the first type of roofing granule 86 is coated with a solar heat reflective coating material thus forming solar heat reflecting granules. A plurality of thermoelectric modules 90 are placed under the section 73 of the shingle with low solar heat reflectance. The modules 90 are connected electrically with a suitable conductor 92 to a bus bar 94 at which electrical potential measurements can be made.

When exposed to solar radiation, the non-solar heat reflective granules 86 absorb solar heat to a greater extent than the solar heat reflective granules 84. However, in this embodiment, heat is transferred in the z-direction reflecting the construction of the thermoelectric modules employed, and the potential measured depends on the extent to which heat is dissipated from the "cold" end of the modules.

Figure 4:
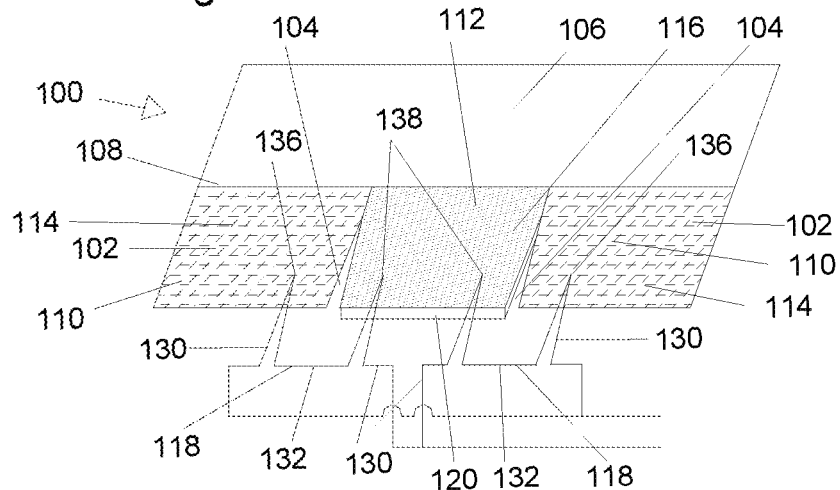
FIG. 4 is a schematic representation of a fourth embodiment of a thermoelectric roofing shingle according to the present invention.

FIG. 4 is a schematic representation of a fourth embodiment of a thermoelectric roofing shingle 100 according to the present invention. The shingle 100 includes three tabs 102 separated by cutouts 104 extending from a head lap portion 106 and a strip of sealant material 108 for adhering the tabs of an overlying shingle (not shown). The tabs 102 include two outer tabs 110 and an inner tab 112. The outer tabs 110 are covered with a first type of roofing granules 114 and the inner tab 112 is coated with a second type of roofing granule 116. A layer of thermal insulation 120 is positioned under the inner tab 112. The first type of roofing granule 114 is coated with a conventional non-solar heat reflective coating material thus forming non-solar heat reflecting granules, while the second type of roofing granule 116 is coated with a solar heat reflective coating material thus forming solar heat reflecting granules. A pair of thermocouples 118 bridges the outer tabs 110 and the inner tab 112. Each thermocouple 118 includes a first wire 130 formed from a first metal and a second wire 132 formed from a second metal. The first and second wires 130, 132 are connected under the outer tabs 110 at a first or hot junction 136 and under insulation layer 120 under the inner tab 112 to form a second or cold junction 138, while the ends of the two thermocouples 118 are electrically connected in parallel to drive a load (not shown). When exposed to solar radiation, the non-solar heat reflective granules 114 absorb solar heat to a greater extent than the solar heat reflective granules 116, so that a temperature difference is created between the inner tab 112 and the outer tabs 110, which in turns creates an electrical potential difference between the hot junctions 136 and the cold junctions 138 under the insulation layer 120 under the inner tab 112, driving an electric current to flow through the load.

Figure 5:
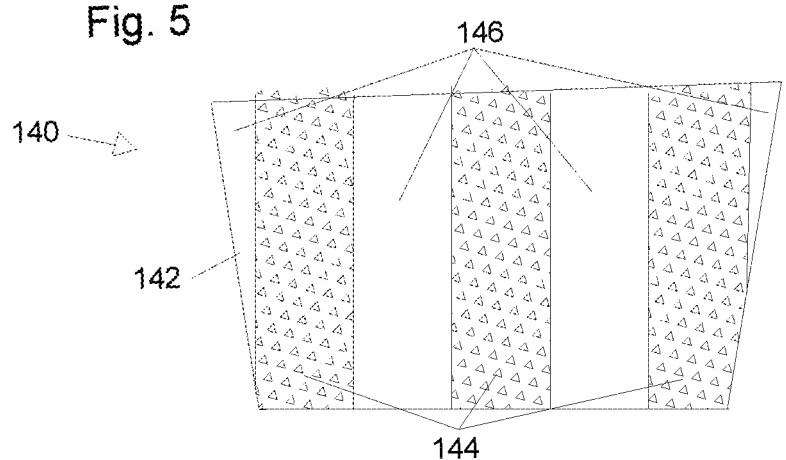
FIG. 5 is a schematic representation of a portion of a thermoelectric roofing shingle according to the present invention showing a first scheme for placement of areas of enhanced solar heat absorption and reduced solar absorption.

FIG. 5 is a schematic representation of a fifth embodiment of a thermoelectric roofing shingle 140 according to the present invention. The shingle 140 includes a plurality of tabs 142 separated by cutouts (not shown) extending from a head lap portion (not shown). In this embodiment, each of the tabs 142 is covered with two types of roofing granules arranged in parallel alternating strips 144, 146, extending vertically or perpendicular to the long axis of the shingle 140. A first type of roofing granules covers one set of strips 144 and a second type of roofing granule covers the second set of strips 146. The first type of roofing granule is coated with a conventional non-solar heat reflective coating material thus forming non-solar heat reflecting granules to give solar heat absorptive strips 144, while the second type of roofing granule is coated with a solar heat reflective coating material thus forming solar heat reflecting granules to give solar heat reflective strips 146. Thermoelectric elements (not shown) are positioned underneath the tab 142 bridging the boundaries formed by the heat absorptive strips 144 and the solar heat reflective strips 146 and are connected to provide an electric current. The coatings for the first and second types of roofing granules are selected to provide a similar visual appearance.

Figure 6:
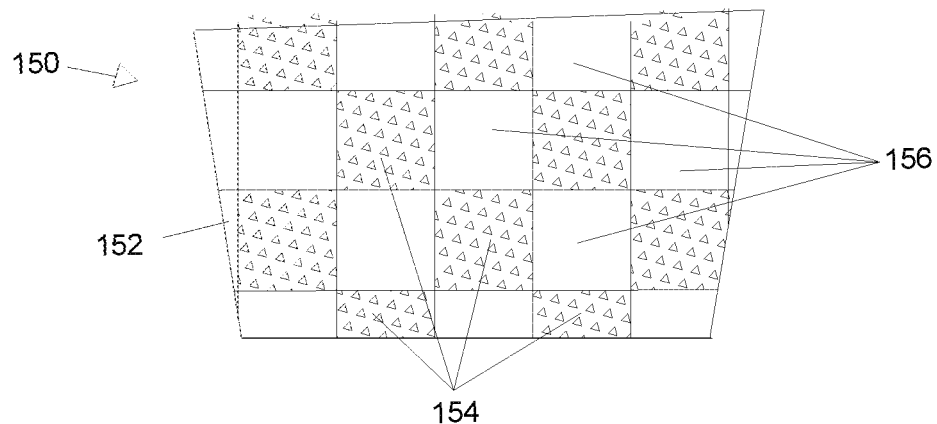
FIG. 6 is a schematic representation of a portion of a thermoelectric roofing shingle according to the present invention showing a second scheme for placement of areas of enhanced solar heat absorption and reduced solar absorption.

FIG. 6 is a schematic representation of a sixth embodiment of a thermoelectric roofing shingle 150 according to the present invention. The shingle 150 includes a plurality of tabs 152 separated by cutouts (not shown) extending from a head lap portion (not shown). In this embodiment, each of the tabs 152 is covered with two types of roofing granules arranged in a checkerboard pattern of generally rectangular areas 154, 156. A first type of roofing granules covers one set of areas 154 and a second type of roofing granule covers the second set of areas 156. The first type of roofing granule is coated with a conventional non-solar heat reflective coating material thus forming non-solar heat reflecting granules to give solar heat absorptive areas 154, while the second type of roofing granule is coated with a solar heat reflective coating material thus forming solar heat-reflecting granules to give solar heat reflective areas 156. A plurality of thermocouples (not shown) are positioned underneath the tab 152 bridging the boundaries formed by the heat absorptive areas 154 and the solar heat reflective areas 156 and connected to provide an electric current. The coatings for the first and second types of roofing granules are selected to provide a nearly identical visual appearance.

FIG. 7 is a schematic representation of a fifth embodiment of a thermoelectric roofing shingle 160 according to the present invention. The shingle 160 includes a plurality of tabs 162 separated by cutouts (not shown) extending from a head lap portion (not shown). In this embodiment, each of the tabs 162 is covered with two types of roofing granules arranged in parallel alternating strips 164, 166, running horizontally, or parallel to the long axis of the shingle 160. A first type of roofing granules covers one set of strips 164 and a second type of roofing granule covers the second set of strips 166. The first type of roofing granule is coated with a conventional non-solar heat reflective coating material thus forming non-solar heat reflecting granules to give solar heat absorptive strips 164, while the second type of roofing granule is coated with a solar heat reflective coating material thus forming solar heat-reflecting granules to give solar heat reflective strips 166. Thermoelectric elements (not shown) are positioned underneath the tab 162 bridging the boundaries formed by the heat absorptive strips 164 and the solar heat reflective strips 166 and are connected to provide an electric current. The coatings for the first and second types of roofing granules are selected to provide a similar visual appearance.

FIG. 8 is a schematic representation of a sixth embodiment of a thermoelectric roofing shingle 170 according to the present invention. The shingle 170 includes an upper layer 172 and a coextensive lower layer 174 adhered to the upper layer 172 by suitable means, such as by an adhesive material (not shown). The upper layer 172 has a series of generally trapezoidal cutouts 176 formed in the lower portion thereof such that the upper surface of the lower layer 174 is visible through the cutouts 176 forming generally trapezoidal areas 178, and such that the a plurality of generally trapezoidal tabs 180 are formed in the upper layer 172 in between the cutouts 176. In this embodiment, the lower or tab portion of the upper layer 172 of the shingle 170 is covered with a first type of granule 182, and the lower layer 174 is covered with a second type of granule 184. The upper or head lap portion of the upper layer 182 is covered with a third type of granule 186. The second type of roofing granule is coated with a conventional non-solar heat reflective coating material thus forming non-solar heat reflecting granules to give solar heat absorptive areas 178, while the first type of roofing granule is coated with a solar heat reflective coating material thus forming solar heat reflecting granules to give solar heat reflective tabs 180. Thermoelectric elements (not shown) are positioned underneath lower layer 174 and bridge the boundaries 188 between the solar heat reflective tabs 180 and the solar heat absorptive exposed areas 178 of the lower layer 174 and are connected to provide an electric current. The coatings for the first and second types of roofing granules are selected to provide a similar visual appearance. The optional third type of granule 186 can be coated with a conventional coating material to reduce manufacturing cost, since the head lap portion of the shingle 170 is covered by the lower portion of another shingle when the shingle 170 is installed on a roof.

Figure 9:
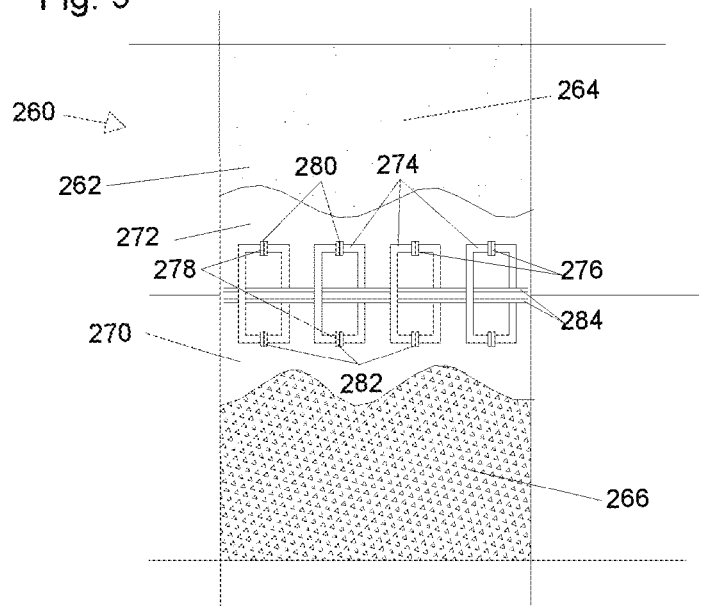
FIG. 9 is a schematic representation of a fifth embodiment of a thermoelectric roofing shingle according to the present invention.

FIG. 9 is a schematic representation of a seventh embodiment of a thermoelectric roofing shingle 260 according to the present invention. The shingle 260 includes a plurality of tabs 262 separated by cutouts (not shown) extending from a head lap portion (not shown). In this embodiment, each of the tabs 262 is covered with two types of roofing granules arranged in a checkerboard pattern of generally rectangular areas 264, 266. A first type of roofing granules covers one set of areas 264 and a second type of roofing granule covers the second set of areas 266. The first type of roofing granule is coated with a conventional non-solar heat reflective coating material thus forming non-solar heat reflecting granules to give solar heat absorptive areas 264, while the second type of roofing granule is coated with a solar heat reflective coating material thus forming solar heat reflecting granules to give solar heat reflective areas 266. As can be seen in the cutaway portion of the figure, a plurality of thermoelectric units 274 are mounted on an underlying base sheet 272 and together comprise a circuit layer 270. Each of the thermoelectric units 274 include n-type element 276 and a p-type element 278, which bridge the boundaries formed by the heat absorptive areas 264 and the solar heat reflective areas 266. The n-type elements 276 and the p-type elements 278 are connected under the solar heat absorptive areas 264 to give "hot" junctions 280 and under the solar heat reflective areas 266 to give "cold" junctions 282. The thermoelectric units 274 are connected by suitable electric leads 284 to provide an electric current. The coatings for the first and second types of roofing granules are selected to provide a nearly identical visual appearance.

Figure 10:
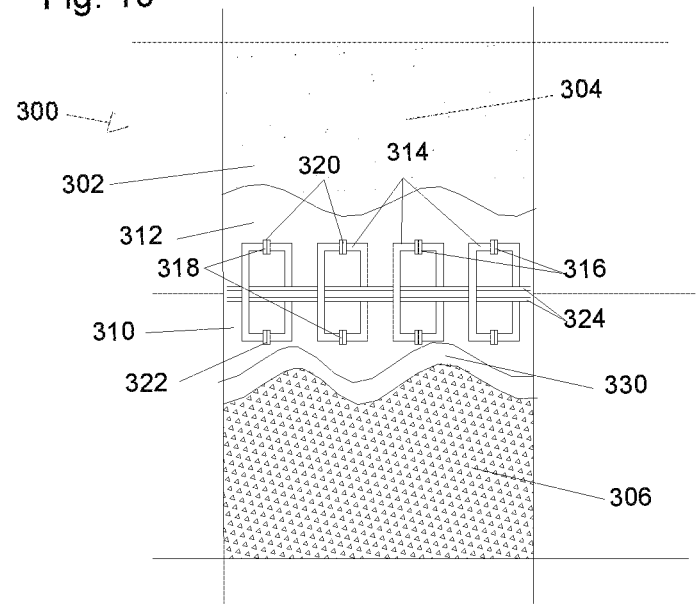
FIG. 10 is a schematic representation of a sixth embodiment of a thermoelectric roofing shingle according to the present invention.

FIG. 10 is a schematic representation of an eighth embodiment of a thermoelectric roofing shingle 300 according to the present invention. The shingle 300 includes a plurality of tabs 302 separated by cutouts (not shown) extending from a head lap portion (not shown). In this embodiment, each of the tabs 302 is covered with two types of roofing granules arranged in a checkerboard pattern of generally rectangular areas 304, 306. A first type of roofing granules covers one set of areas 304 and a second type of roofing granule covers the second set of areas 306. The first type of roofing granule is coated with a conventional non-solar heat reflective coating material thus forming non-solar heat reflecting granules to give solar heat absorptive areas 304, while the second type of roofing granule is coated with a solar heat reflective coating material thus forming solar heat reflecting granules to give solar heat reflective areas 306. As can be seen in the cutaway portion of the figure, a plurality of thermoelectric units 314 are mounted on an underlying base sheet 312 and together comprise a circuit layer 310. A layer of thermal insulation 330 is positioned under the solar heat reflective area 306 and over the respective portions of the thermoelectric units 314. Each of the thermoelectric units 314 includes n-type element 316 and a p-type element 318, which bridge the boundaries formed by the heat absorptive areas 304 and the solar heat reflective areas 306. The n-type elements 316 and the p-type elements 318 are connected under the solar heat absorptive areas 304 to give "hot" junctions 320 and under the solar heat reflective areas 306 to give "cold" junctions 322. The thermoelectric units 314 are connected by suitable electrical leads 324 to provide an electric current. The coatings for the first and second types of roofing granules are selected to provide a nearly identical visual appearance.

FIG. 11 is a schematic representation of a thermoelectric overlay 350 for application to a shingle (not shown) to provide for thermoelectric power generation. The overlay 350 is covered with two types of roofing granules arranged in generally rectangular areas 354, 356. A first type of roofing granules covers one area 354 and a second type of roofing granule covers the second area 356. The first type of roofing granule is coated with a conventional non-solar heat reflective coating material thus forming non-solar heat reflecting granules to give a solar heat absorptive area 354, while the second type of roofing granule is coated with a solar heat reflective coating material thus forming solar heat reflecting granules to give a solar heat reflective area 356. As can be seen in the cutaway portion of the figure, a plurality of thermoelectric units 364 are mounted on an underlying base sheet 362 and together comprise a circuit layer 360. A layer of thermal insulation 380 is positioned under the solar heat reflective area 356 and over the respective portions of the thermoelectric units 364. Each of the thermoelectric units 364 includes n-type element 366 and a p-type element 368, which bridge the boundaries formed by the heat absorptive area 354 and the solar heat reflective area 356. The n-type elements 366 and the p-type elements 368 are connected under the solar heat absorptive areas 354 to give "hot" junctions 370 and under the solar heat reflective areas 356 to give "cold" junctions 372. The thermoelectric units 364 are connected by suitable electrical leads 374 to provide an electric current. The coatings for the first and second types of roofing granules are selected to provide a nearly identical visual appearance. The thermoelectric overlay 350 or a plurality of such overlays can be applied to the upper surface of a shingle (not shown) or to the surface of a previously installed shingles on a roof (not shown) by suitable means such as by application of a suitable adhesive and the electric leads 374 can be connected with other such overlays to provide enhanced electric power from the interconnected array of overlays 350.

The roofing granules of the present invention can be employed in the manufacture of roofing products, such as asphalt shingles and bituminous membranes, using conventional roofing production processes. Typically, bituminous roofing products are sheet goods that include a non-woven base or scrim formed of a fibrous material, such as a glass fiber scrim. The base is coated with one or more layers of a bituminous material such as asphalt to provide water and weather resistance to the roofing product. One side of the roofing product is typically coated with mineral granules to provide durability, reflect heat and solar radiation, provide aesthetic effects, and to protect the bituminous binder from environmental degradation. The roofing granules of the present invention can be embedded in the surface of such bituminous roofing products using conventional methods.

Bituminous roofing products are typically manufactured in continuous processes in which a continuous substrate sheet of a fibrous material such as a continuous felt sheet or glass fiber mat is immersed in a bath of hot, fluid bituminous coating material so that the bituminous material saturates the substrate sheet and coats at least one side of the substrate. Roofing granules are then distributed over selected portions of the top of the sheet, and the bituminous material serves as an adhesive to bind the roofing granules to the sheet when the bituminous material has cooled. The reverse side of the substrate sheet can then be coated with an anti-stick material such as a suitable mineral powder or a fine sand. The sheet can then be cut into conventional shingle sizes and shapes (such as one foot by three feet rectangles), slots can be cut in the shingles to provide a plurality of "tabs" for ease of installation and aesthetic effect, additional bituminous adhesive can be applied in strategic locations and covered with release paper to provide for securing successive courses of shingles during roof installation, and the finished shingles can be packaged. More complex methods of shingle construction can also be employed, such as building up multiple layers of sheet in selected portions of the shingle to provide an enhanced visual appearance, or to simulate other types of roofing products. Alternatively, the sheet can be formed into membranes or roll goods for commercial or industrial roofing applications.

The bituminous material used in manufacturing roofing products according to the present invention is derived from a petroleum-processing by-product such as pitch, "straight-run" bitumen, or "blown" bitumen. The bituminous material can be modified with extender materials such as oils, petroleum extracts, and/or petroleum residues. The bituminous material can include various modifying ingredients such as polymeric materials, such as SBS (styrene-butadiene-styrene) block copolymers, resins, flame-retardant materials, oils, stabilizing materials, anti-static compounds, and the like. Preferably, the total amount by weight of such modifying ingredients is not more than about 15 percent of the total weight of the bituminous material. The bituminous material can also include amorphous polyolefins, up to about 25 percent by weight. Examples of suitable amorphous polyolefins include atactic polypropylene, ethylene-propylene rubber, etc. Preferably, the amorphous polyolefins employed have a softening point of from about 130 degrees C. to about 160 degrees C. The bituminous composition can also include a suitable filler, such as calcium carbonate, talc, carbon black, stone dust, or fly ash, preferably in an amount from about 10 percent to 70 percent by weight of the bituminous composite material.

The following examples are provided to better disclose and teach processes and compositions of the present invention. They are for illustrative purposes only, and it must be acknowledged that minor variations and changes can be made without materially affecting the spirit and scope of the invention as recited in the claims that follow.

Example 1

A thermoelectric shingle was constructed by using a standard Star White 3-tab shingle (XT25 available from CertainTeed Corp., Oxford, N.C.) as the base of high solar heat reflectance surface (Avg. SR=28% measured according to ASTM C1549). A 6" width section of shingle in Moire Black color (XT25 also from CertainTeed) was then laminated on top of the high SR shingle to form the upper surface of low solar reflectance (Avg. SR=3.7% according to ASTM C1549). Five thermo-electric modules (C-AA-300 from Tellurex, Traverse City, Mich.) were then placed underneath the top shingle of low solar reflectance. The thermoelectric modules were then connected in series by connecting the wires from the module and then connecting to a bus bar as final terminal for powder generation monitoring. A schematic diagram of the thermoelectric shingle is shown in FIG. 3.

The thermoelectric shingle was then applied to a ¼" plywood sheet and was then placed outside with a south facing exposure and 12/12 slope. The power output was then recorded by a Fluke 189 RMS multimeter, along with surface temperatures and weather conditions. The results are listed in Table 1. As can be seen, the thermoelectric shingle was found to consistently generate power according to the temperature difference between the top layer of low SR and bottom layer of high SR in outdoor, roof-like condition.

The same thermo-electric shingle was also tested inside a lab by placing it under a light booth to heat up the surface. The light booth is constructed in-house by placing four 50 W flood lights (Philips DuraMax R50 flood light bulb) in a stand with dimensions of 12"W×12"L×16"H. The surface temperatures, voltage output, and testing conditions were recorded and listed in Table 1 also. As can be seen, the shingle was found to be able to produce stable power for relatively long duration, with a consistent surface temperature difference under lab conditions.

TABLE 1

| Run No. | Location | Surface temperatures | | Power output, VDC | Test conditions |
| | | Low SR | High SR | | |
| --- | --- | --- | --- | --- | --- |
| 1 | Outdoor | Avg. 100 deg. F. | Avg. 88.5 deg. F. | 0.113-0.14 | Cloudy, with ~50 percent cloud cover, light wind, air temp 70 deg. F. |
| 2 | Indoor | Avg. 110 deg. F. | Avg. 99 deg. F. | 0.185-0.189 | Indoor room conditions |

Example 2

Figure 12:
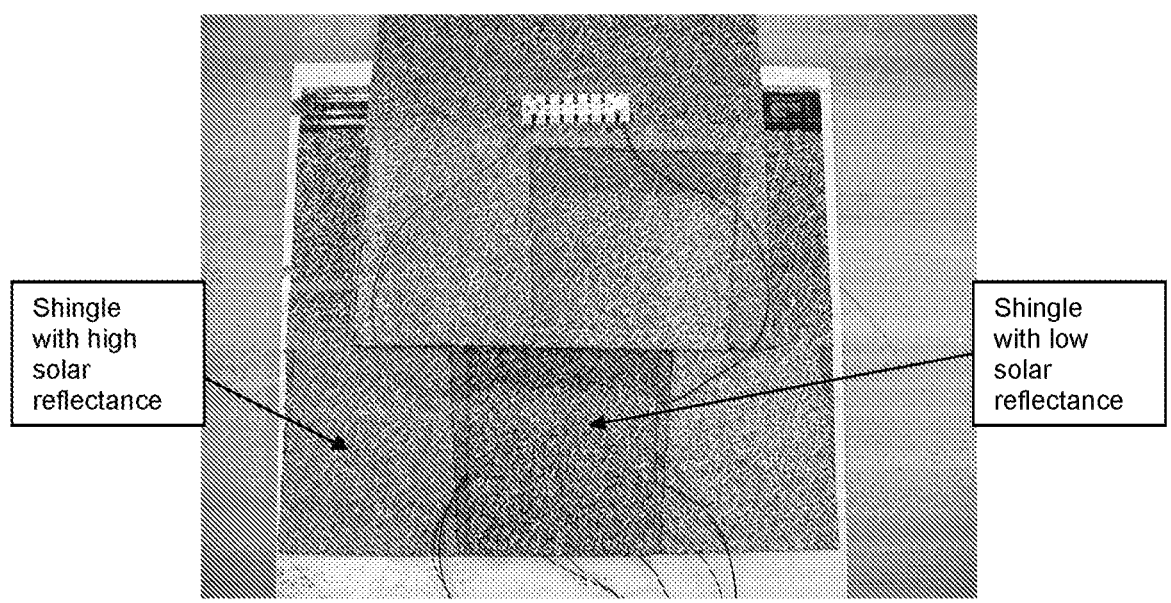
FIG. 12 is a photograph of a sample deck including thermoelectric roofing shingles according to the present invention.

A thermoelectric shingle sample deck with shingles having similar colors was constructed using commercially available shingles that have different solar reflectivity to generate temperature differences for power generation. The thermoelectric shingle deck was constructed in the configuration shown in FIG. 3, and a photograph of the actual sample deck is shown in FIG. 12. The sample deck consists of shingles with averaged solar reflectance of 28% and color of $L^*=41.44$, $a^*=9.24$, $b^*=15.82$ (Landmark Solaris in Reshawn Shake color, commercially available from CertainTeed Corp) as the cool surface; and shingles with averaged solar reflectance of 11.4% with a color of $L^*=38.14$, $a^*=7.79$, $b^*=15.68$ (Landmark shingle in Reshawn Shake color, commercially available from CertainTeed Corp.) as the hot surface. The sample deck has a uniform color appearance with the color difference $DE^*<5$ unit. The thermoelectric circuit was constructed in the same way as in Example 1 and is shown schematically in FIG. 3. The sample deck was then placed outside into direct sun on a flat surface without any shading. The weather was sunny with scattered cloud and the air temperature was 79° F. (26 degrees C.) according to local weather station data at the time of experimentation. The result of the experiment is provided in Table 2.

TABLE 2

| | | Surface temperatures | | Power output, | |
|---|---|---|---|---|---|
| Run No. | Location | Low SR | High SR | $V_{DC}$ | Test conditions |
| 1 | Outdoor | 135.8° F. | 110.5° F. | 0.417 | Sunny with scattered cloud, light wind, air T = 79° F. |
| 2 | Outdoor | 135.1° F. | 116° F. | 0.336 | Indoor room conditions |

Various modifications can be made in the details of the various embodiments of the processes, compositions and articles of the present invention, all within the scope and spirit of the invention and defined by the appended claims.

The invention claimed is:

1. A method of generating electrical power using a roofing system comprising
a roof-surfacing material comprising a roofing shingle having a headlap zone and an exposure zone, wherein the exposure zone includes
at least one solar heat reflective area having a bituminous substrate covered with solar heat reflective roofing granules embedded therein, and
at least one solar heat absorptive area having a bituminous substrate covered with solar heat absorptive roofing granules embedded therein so as to form a temperature difference between the at least one solar heat reflective area and the at least one solar heat absorptive area of the roof-surfacing material when the at least one solar heat reflective area and the at least one solar heat absorptive area are exposed to solar radiation, wherein said at least one solar heat reflective area has a first solar heat reflectivity, wherein said at least one solar heat absorptive area has a second solar heat reflectivity, and wherein the difference between the first solar heat reflectivity and the second solar heat reflectivity is at least ten percent; and
a plurality of thermoelectric power generating elements connected in series to provide a predefined output voltage, each of the thermoelectric power generating elements having a first junction in thermal contact with at least one of the solar heat reflective areas and having a second junction in thermal contact with at least one of the solar heat absorptive areas,
the method comprising exposing the at least one solar heat absorptive area and the at least one solar heat reflective area to solar radiation so as to form a temperature difference between the at least one solar heat reflective area and the at least one solar heat absorptive area; and generating electrical power using the series-connected plurality of thermoelectric power generating elements in response to the temperature difference between the at least one solar heat reflective area and the at least one solar heat absorptive area.

2. A method according to claim 1, wherein in the roof-surfacing material the at least one solar heat reflective area differs in E* from the at least one solar heat absorptive area by less than 5.

3. A method according to claim 1, wherein in the roof-surfacing material the at least one solar heat reflective area differs in E* from the at least one solar heat absorptive area by less than 2.

4. A method according to claim 1, wherein in the roof-surfacing material the difference between the first solar heat reflectivity and the second solar heat reflectivity is at least twenty percent.

5. A method according to claim 1, wherein the roofing system comprises a plurality of thermoelectric power generating elements, and wherein each of said plurality of thermoelectric power generating elements is in thermal contact with said at least one solar heat absorptive area, and wherein each of said plurality of thermoelectric power generating elements is in thermal contact with said at least one heat reflective area.

6. A method according to claim 1, wherein said at least one solar heat absorptive area is lateral spaced from said at least one solar heat reflective area so as not to overlap said at least one solar heat reflective area.

7. A method according to claim 1, wherein the roofing system further comprises a layer of thermal insulation positioned under said at least one solar heat reflective area.

8. A method according to claim 1, wherein the difference between the first solar heat reflectivity and the second solar heat reflectivity is at least twenty percent; and the at least one solar heat reflective area differs in E* from the at least one solar heat absorptive area by less than 5.

9. A method according to claim 1, wherein the difference between the first solar heat reflectivity and the second solar heat reflectivity is at least twenty percent; and the at least one solar heat reflective area differs in E* from the at least one solar heat absorptive area by less than 5.

10. A method of generating electrical power using a roofing system comprising
a roof-surfacing material comprising a roofing shingle having a headlap zone and an exposure zone, wherein the exposure zone includes
at least one solar heat reflective area having a bituminous substrate covered with solar heat reflective roofing granules embedded therein, and
at least one solar heat absorptive area having a bituminous substrate covered with solar heat absorptive roofing granules embedded therein so as to form a temperature difference between the at least one solar heat reflective area and the at least one solar heat absorptive area of the roof-surfacing material when the at least one solar heat reflective area and the at least one solar heat absorptive area are exposed to solar radiation, wherein said at least one solar heat reflective area has a first solar heat reflectivity, wherein said at least one solar heat absorptive area has a second solar heat reflectivity, wherein the difference between the first solar heat reflectivity and the second solar heat reflectivity is at least ten percent, and wherein the at least one solar heat reflective area differs in E* from the at least one solar heat absorptive area by less than 10; and
a plurality of thermoelectric power generating elements connected in series to provide a predefined output voltage, each of the thermoelectric power generating elements having a first junction in thermal contact with at least one of the solar heat reflective areas and having a second junction in thermal contact with at least one of the solar heat absorptive areas, the method comprising exposing the at least one solar heat absorptive area and the at least one solar heat reflective area to solar radiation so as to form a temperature difference between the at least one solar heat reflective area and the at least one solar heat absorptive area; and generating electrical power using the series-connected plurality of thermoelectric power generating elements in response to the temperature difference between the at least one solar heat reflective area and the at least one solar heat absorptive area.

* * * * *